(12) United States Patent
Tamaso

(10) Patent No.: US 12,087,821 B2
(45) Date of Patent: Sep. 10, 2024

(54) METHOD FOR MANUFACTURING SILICON CARBIDE SEMICONDUCTOR DEVICE AND SILICON CARBIDE SEMICONDUCTOR DEVICE

(71) Applicant: SUMITOMO ELECTRIC INDUSTRIES, LTD., Osaka (JP)

(72) Inventor: Hideto Tamaso, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 398 days.

(21) Appl. No.: 17/595,405

(22) PCT Filed: Jul. 13, 2020

(86) PCT No.: PCT/JP2020/027284
§ 371 (c)(1),
(2) Date: Nov. 16, 2021

(87) PCT Pub. No.: WO2021/010382
PCT Pub. Date: Jan. 21, 2021

(65) Prior Publication Data
US 2022/0231129 A1    Jul. 21, 2022

(30) Foreign Application Priority Data
Jul. 17, 2019 (JP) ................................. 2019-131806

(51) Int. Cl.
*H01L 29/16* (2006.01)
*H01L 29/66* (2006.01)
*H01L 29/786* (2006.01)

(52) U.S. Cl.
CPC .... *H01L 29/1608* (2013.01); *H01L 29/66068* (2013.01); *H01L 29/78684* (2013.01)

(58) Field of Classification Search
CPC ............. H01L 21/0485; H01L 29/1608; H01L 29/401; H01L 29/41741; H01L 29/45;
(Continued)

(56) References Cited

U.S. PATENT DOCUMENTS 8,823,017 B2    9/2014   Tamaso
9,893,162 B2    2/2018   Ohse et al.
(Continued)

FOREIGN PATENT DOCUMENTS

JP    2001-185507    7/2001
JP    2003-158259    5/2003
(Continued)

OTHER PUBLICATIONS

Office Action mailed on Feb. 23, 2024 with respect to the related U.S. Appl. No. 17/595,007.

*Primary Examiner* — Fazli Erdem
(74) *Attorney, Agent, or Firm* — IPUSA, PLLC

(57) ABSTRACT

A method for manufacturing a silicon carbide semiconductor device, includes the steps of depositing an insulating film on a principal surface of a silicon carbide substrate, forming a contact hole in the insulating film and exposing the principal surface, forming a Si film on bottom and a side surfaces of the contact hole, and a top surface of the insulating film, removing the Si film on the bottom surface of the contact hole and exposing the principal surface, depositing a Ni film on the bottom surface of the contact hole and the Si film, and performing a heat treatment to form a first alloy layer, which becomes an ohmic electrode, at the bottom surface of the contact hole by Si included in the substrate and the Ni film, and a second alloy layer at the top surface of the insulating film by the Si film and the Ni film.

17 Claims, 11 Drawing Sheets

(58) Field of Classification Search
CPC .............. H01L 29/66068; H01L 29/78; H01L 29/7802; H01L 29/78684
USPC ........................................................ 257/77
See application file for complete search history.

(56) References Cited

U.S. PATENT DOCUMENTS

| | | | |
|---|---|---|---|
| 2017/0271486 A1* | 9/2017 | Komatsu | ............. H01L 21/0485 |
| 2019/0115439 A1 | 4/2019 | Utsumi et al. | |
| 2022/0231129 A1 | 7/2022 | Tamaso | |

FOREIGN PATENT DOCUMENTS

| | | |
|---|---|---|
| JP | 2005-276978 | 10/2005 |
| JP | 2010-103229 | 5/2010 |
| JP | 2012-099598 | 5/2012 |
| JP | 2013-058587 | 3/2013 |
| JP | 2017-175115 | 9/2017 |
| JP | 2018-050008 | 3/2018 |
| JP | 2019-075472 | 5/2019 |

* cited by examiner

METHOD FOR MANUFACTURING SILICON CARBIDE SEMICONDUCTOR DEVICE AND SILICON CARBIDE SEMICONDUCTOR DEVICE

TECHNICAL FIELD

The present disclosure relates to methods for manufacturing silicon carbide semiconductor devices, and silicon carbide semiconductor devices.

This application is based upon and claims priority to Japanese Patent Application No. 2019-131806 filed on Jul. 17, 2019, the entire contents of which are incorporated herein by reference.

BACKGROUND ART

In the processes of manufacturing a silicon carbide semiconductor device, there is a process of forming a source electrode. In the process of forming the source electrode, an insulating film is first formed on a surface of a silicon carbide substrate using silicon oxide or the like, for example, and a portion of the insulating film is removed until the surface of the silicon carbide substrate is exposed so as to form a contact hole. Next, a Ni (nickel) film is deposited on the entire surface including the surface of the silicon carbide substrate and a top surface of the insulating film, and a heat treatment is performed to form a NiSi alloy by Si (silicon) and Ni included in the silicon carbide substrate, so as to form an ohmic electrode. The source electrode is famed by the ohmic electrode which is formed in this manner.

PRIOR ART DOCUMENTS

Patent Documents

Patent Document 1: Japanese Laid-Open Patent Publication No. 2005-276978
Patent Document 2: Japanese Laid-Open Patent Publication No. 2017-175115
Patent Document 3: Japanese Laid-Open Patent Publication No. 2012-99598

DISCLOSURE OF THE INVENTION

A method for manufacturing a silicon carbide semiconductor device according to the present disclosure includes the steps of preparing a silicon carbide substrate; depositing an insulating film on one principal surface of the silicon carbide substrate; forming a contact hole in the insulating film, and exposing the one principal surface at a bottom surface of the contact hole; forming a Si film on the bottom surface and a side surface of the contact hole, and a top surface of the insulating film; removing the Si film on the bottom surface of the contact hole, and exposing the one principal surface; depositing a Ni film on the bottom surface of the contact hole, and the Si film; and performing a heat treatment after depositing the Ni film, wherein the heat treatment forms a first alloy layer, which becomes an ohmic electrode, at the bottom surface of the contact hole by Si included in the silicon carbide substrate and the Ni film, and forms a second alloy layer at the top surface of the insulating film by the Si film and the Ni film.

MODE OF CARRYING OUT THE INVENTION

Figure 1:
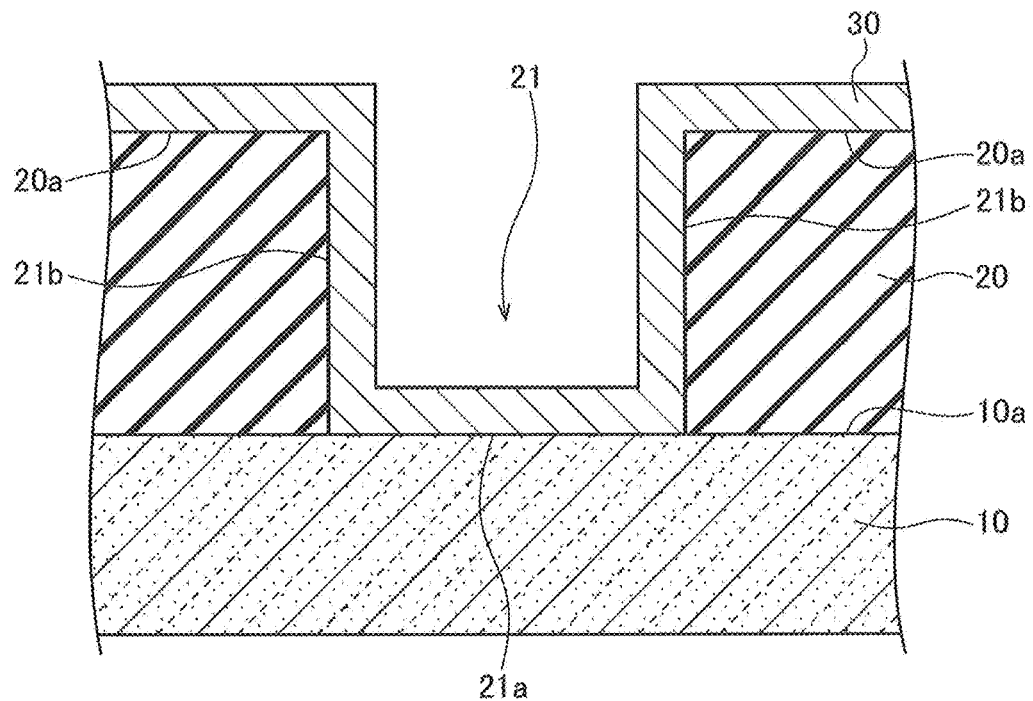
FIG. 1 is a process chart (1) of a method for manufacturing a semiconductor device.

Problem to be Solved by the Present Disclosure

Fine patterning of Ni is difficult because dry etching of Ni is difficult, and coagulation of Ni occurs if a heat treatment is performed in a state where a Ni film remains as is on an interlayer insulator. When a barrier layer using TiN or the like is deposited on the Ni in the coagulated state, cracks or fractures are formed in the barrier layer, and Na (sodium) or K (potassium) may enter inside the silicon carbide semiconductor device from the outside through the cracked or fractured portions of the barrier layer. It is undesirable for such Na or K to enter inside the silicon carbide semiconductor device, because this causes a reliability of the silicon carbide semiconductor device to deteriorate.

For this reason, there are demands for a method for manufacturing a silicon carbide semiconductor device which can form an ohmic electrode in a contact hole of an interlayer insulator, without deteriorating the reliability.

Effects of the Present Disclosure

According to the present disclosure, it is possible to form an ohmic electrode in a contact hole of an interlayer insulator, without deteriorating the reliability.

Embodiments for carrying out the present disclosure will be described below.

DESCRIPTION OF EMBODIMENTS OF THE PRESENT DISCLOSURE

First, embodiments of the present disclosure will be described with reference to examples. In the following description, the same or corresponding elements are designated by the same reference numerals, and a description of the same or corresponding elements will not be repeated.

[1] A method for manufacturing a silicon carbide semiconductor device according to one aspect of the present disclosure includes the steps of preparing a silicon carbide substrate; depositing an insulating film on one principal surface of the silicon carbide substrate; forming a contact hole in the insulating film, and exposing the one principal surface at a bottom surface of the contact hole; forming a Si film on the bottom surface and a side surface of the contact hole, and a top surface of the insulating film; removing the Si film on the bottom surface of the contact hole, and exposing the one principal surface; depositing a Ni film on the bottom surface of the contact hole, and the Si film; and performing a heat treatment after depositing the Ni film, wherein the heat treatment forms a first alloy layer, which becomes an ohmic electrode, at the bottom surface of the contact hole by Si included in the silicon carbide substrate and the Ni film, and forms a second alloy layer at the top surface of the insulating film by the Si film and the Ni film.

In this case, it is possible to form an ohmic electrode in the contact hole of the interlayer insulating film, without deteriorating the reliability.

[2] A temperature of the heat treatment may be 800° C. or higher but 1100° C. or lower.

In this case, it is possible to form an ohmic electrode in the contact hole of the interlayer insulating film, without deteriorating the reliability.

[3] In a state after the step of depositing the Ni film and before the step of performing the heat treatment, a ratio of a number of Si atoms, to a sum of the number of Si atoms and a number of Ni atoms, per unit area included in the Si film and the Ni film at the top surface of the insulating film, may be 33 atomic % or greater but 67 atomic % or less.

Generally, any one of $Ni_2Si$, $NiSi$, and $NiSi_2$ is formed as the temperature reaches of the heat treatment temperature. If the original ratio of Si to Ni falls within this range, a combination of such compounds can eliminate the unreacted Ni or the unreacted Si.

[4] A thickness of the Ni film may be 5 nm or greater but 100 nm or less.

In this case, it is possible to form a desired ohmic electrode.

[5] A thickness of the Si film may be 5 nm or greater but 100 nm or less, and a thickness of the Ni film may be 5 nm or greater but 100 nm or less.

In this case, it is possible to form a desired ohmic electrode.

[6] The method may include the steps of removing, after the process performing the heat treatment, an unreacted portion of the Ni film which does not react with either the silicon carbide substrate or the Si film, by wet etching.

In this case, it is possible to prevent the Ni from reacting with other metals and becoming deformed in subsequent steps.

[7] The second alloy layer may also be formed on the side surface of the contact hole.

Although the side surface of the contact hole is easily subject to etching damage, it is possible in this case to protect this region using stable nickel silicide.

[8] A silicon carbide semiconductor device according to one aspect of the present disclosure includes a silicon carbide substrate having a first principal surface, and a second principal surface opposite to the first principal surface; an insulating film provided on the first principal surface; a contact hole provided in the insulating film; a first alloy layer, including Ni and Si, in contact with the silicon carbide substrate at a bottom surface of the contact hole; and a second alloy layer, including Ni and Si, provided on a top surface of the insulating film, wherein the first alloy layer makes ohmic contact with the silicon carbide substrate.

In this case, it is possible to prevent the reliability from deteriorating in the semiconductor device in which an ohmic electrode is formed in the contact hole of the interlayer insulator.

[9] A Si concentration of Si included in the second alloy layer may be higher than a Si concentration of Si included in the first alloy layer.

Because the first alloy layer is formed by the reaction between nickel and silicon carbide during the heat treatment, the first alloy layer is mainly composed of unreacted carbon which does not react to $Ni_2Si$. For this reason, a content ratio of Si in the first alloy layer is at least 33% or less.

[10] The second alloy layer may also be provided on a side surface of the contact hole.

Although the side surface of the contact hole is easily subject to etching damage, it is possible in this case to protect this region using stable nickel silicide.

[11] A ratio of a number of Si atoms, to a sum of the number of Si atoms and a number of Ni atoms, per unit area included in the second alloy layer, may be 33 atomic % or greater but 67 atomic % or less.

Generally, any one of $Ni_2Si$, $NiSi$, and $NiSi_2$ is formed as the temperature reaches of the heat treatment temperature. If the original ratio of Si to Ni falls within this range, a combination of such compounds can eliminate the unreacted Ni or the unreacted Si.

[12] A barrier layer on the second alloy layer, and an interconnect layer on the barrier layer, may be provided.

Because the surface of the second alloy layer is flat, even if the barrier layer is formed on the second alloy layer, and the interconnect layer is formed on the barrier layer, cracks or fractures are not generated in the barrier layer, thereby preventing entry of Na or K from the outside.

[13] The barrier layer may be formed of TiN or TaN.

Even if the barrier layer is formed of TiN or TaN, it is possible to prevent entry of Na or K from the outside.

[14] The interconnect layer may be formed of a metal including Al.

Even if the interconnect layer is formed of Al, it is possible to prevent the entry of Na or K from the outside.

DETAILS OF EMBODIMENTS OF THE PRESENT DISCLOSURE

Although one embodiment of the present disclosure will now be described in detail, the present disclosure is not limited thereto.

First, a description will be given of a process of forming an ohmic contact in a contact hole formed in an interlayer insulator, in the method for manufacturing the silicon carbide semiconductor device.

As illustrated in FIG. 1, an insulating film 20, which becomes an interlayer insulator having a contact hole 21, is formed on a principal surface 10a of a silicon carbide substrate 10, and a Ni film 30 is further formed by sputtering. Hence, the Ni film 30 is formed on the principal surface 10a of the silicon carbide substrate 10 exposed at a top surface 20a of the insulating film 20, a side surface 21b of the contact hole 21, and a bottom surface 21a of the contact hole 21.

Generally, because dry etching of the Ni film 30 is difficult, and it is not easy to remove only the Ni film 30 on the top surface 20a of the insulating film 20 by wet etching, a heat treatment is performed in a subsequent process in a state where the Ni film 30 remains famed on the top surface 20a of the insulating film 20.

Figure 2:
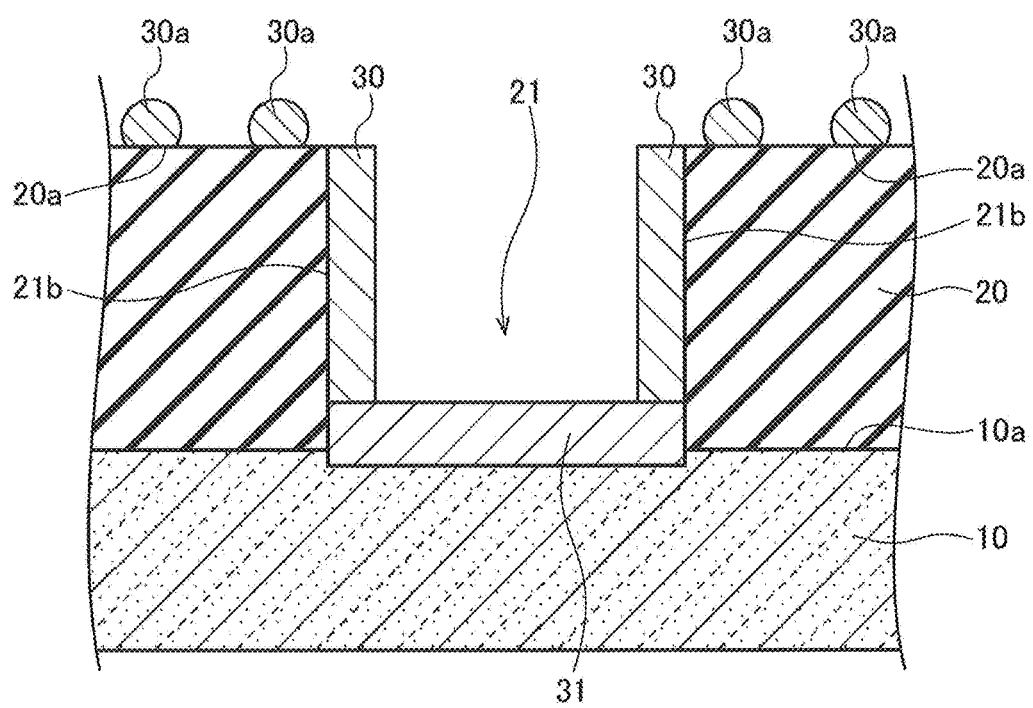
FIG. 2 is a process chart (2) of the method for manufacturing the semiconductor device.

More particularly, as illustrated in FIG. 2, an ohmic electrode is famed by performing the heat treatment at a temperature of 800° C. to 1100° C. Specifically, by performing the heat treatment at the temperature of 800° C. to 1100° C., a NiSi alloy layer 31 is formed by Ni included in the Ni film formed on the bottom surface of the contact hole 21 and Si included in the silicon carbide substrate 10. The NiSi alloy layer 31 which is formed in this manner becomes the ohmic electrode. In this state, the Ni film 30 on the top surface 20a of the insulating film 20 coagulates by the heat treatment, and forms a Ni coagulation portion 30a.

Figure 3:
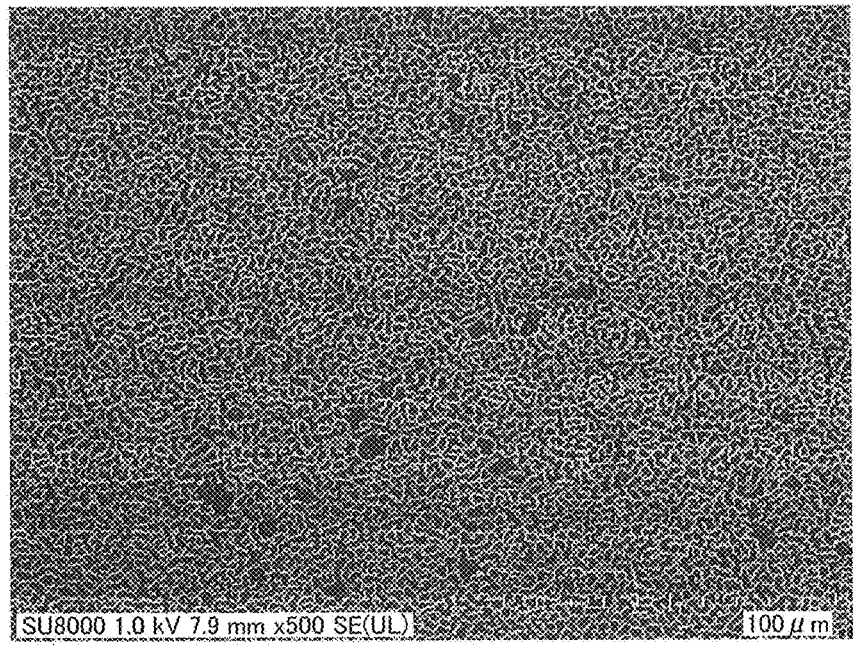
FIG. 3 is an SEM image (1) of a state after depositing a Ni film and performing a heat treatment.
Figure 4:
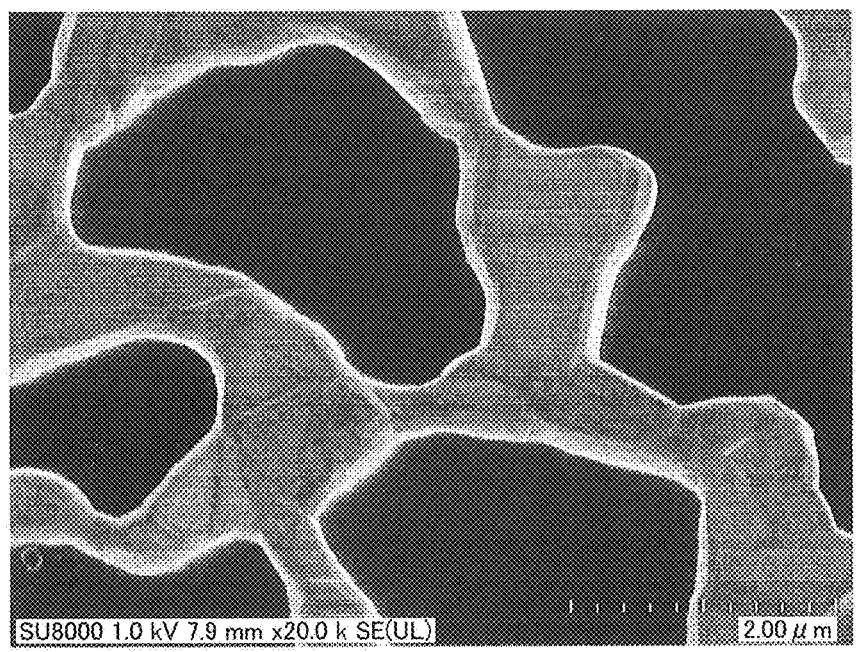
FIG. 4 is the SEM image (2) of the state after depositing the Ni film and performing the heat treatment.

FIG. 3 and FIG. 4 are SEM images of the top surface of in this state, observed by an SEM (Scanning Electron Microscope), where a magnification in FIG. 3 is 500 times, and the magnification in FIG. 4 is 20,000 times. In FIG. 3 and FIG. 4, a white portion indicates the Ni coagulation portion 30a, and a black portion indicates the insulating film 20.

Figure 5:
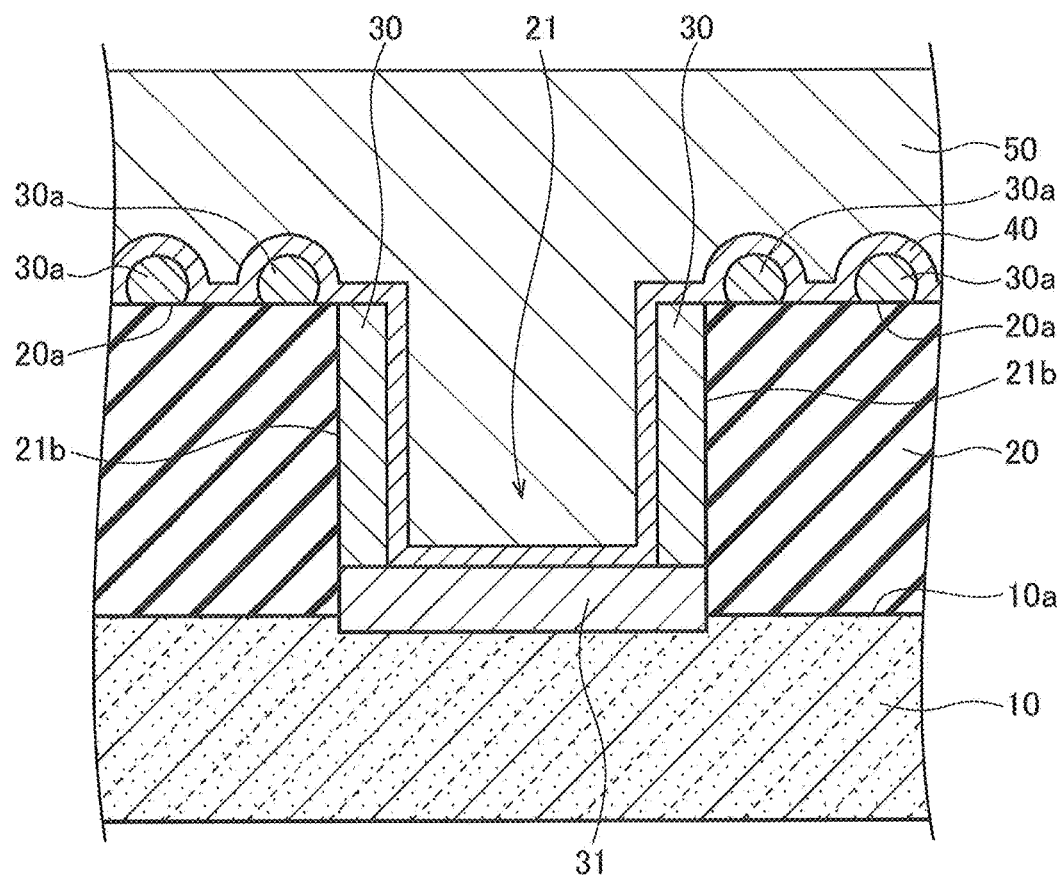
FIG. 5 is a process chart (3) of the method for manufacturing the semiconductor device.

Next, as illustrated in FIG. 5, an interconnect layer 50 is formed by forming a TiN film 40 which is a barrier metal, and further forming Al (aluminum) on the TiN film 40. Because the Ni coagulation portion 30a is locally famed on the top surface 20a of the insulating film 20, cracks, fractures, or the like are easily generated in the TiN film 40 which is formed on the top surface 20a of the insulating film 20 and the Ni coagulation portion 30a.

Because Na or K which enters from the outside can easily pass through the Al forming the interconnect layer 50, if the cracks, fractures, or the like are generated in the TiN film 40, the Na or K may enter inside the silicon carbide semiconductor device via the cracks, fractures, or the like in the interconnect layer 50 and the TiN film 40. It is undesirable for such Na or K to enter inside the silicon carbide semiconductor device, because this causes a reliability of the silicon carbide semiconductor device to deteriorate.

If the Ni film 30 formed on the top surface 20a of the insulating film 20 can be removed after the process illustrated in FIG. 1, the Ni coagulation portion 30a described above will not be formed. However, as described above, dry etching of the Ni film 30 is difficult, and it is not easy to remove only the Ni film 30 on the top surface 20a of the insulating film 20 by wet etching. For this reason, the heat treatment is performed to form the ohmic electrode, in a state where the Ni film 30 remains formed on the top surface 20a of the insulating film 20.

(Method for Manufacturing Semiconductor Device)

Figure 6:
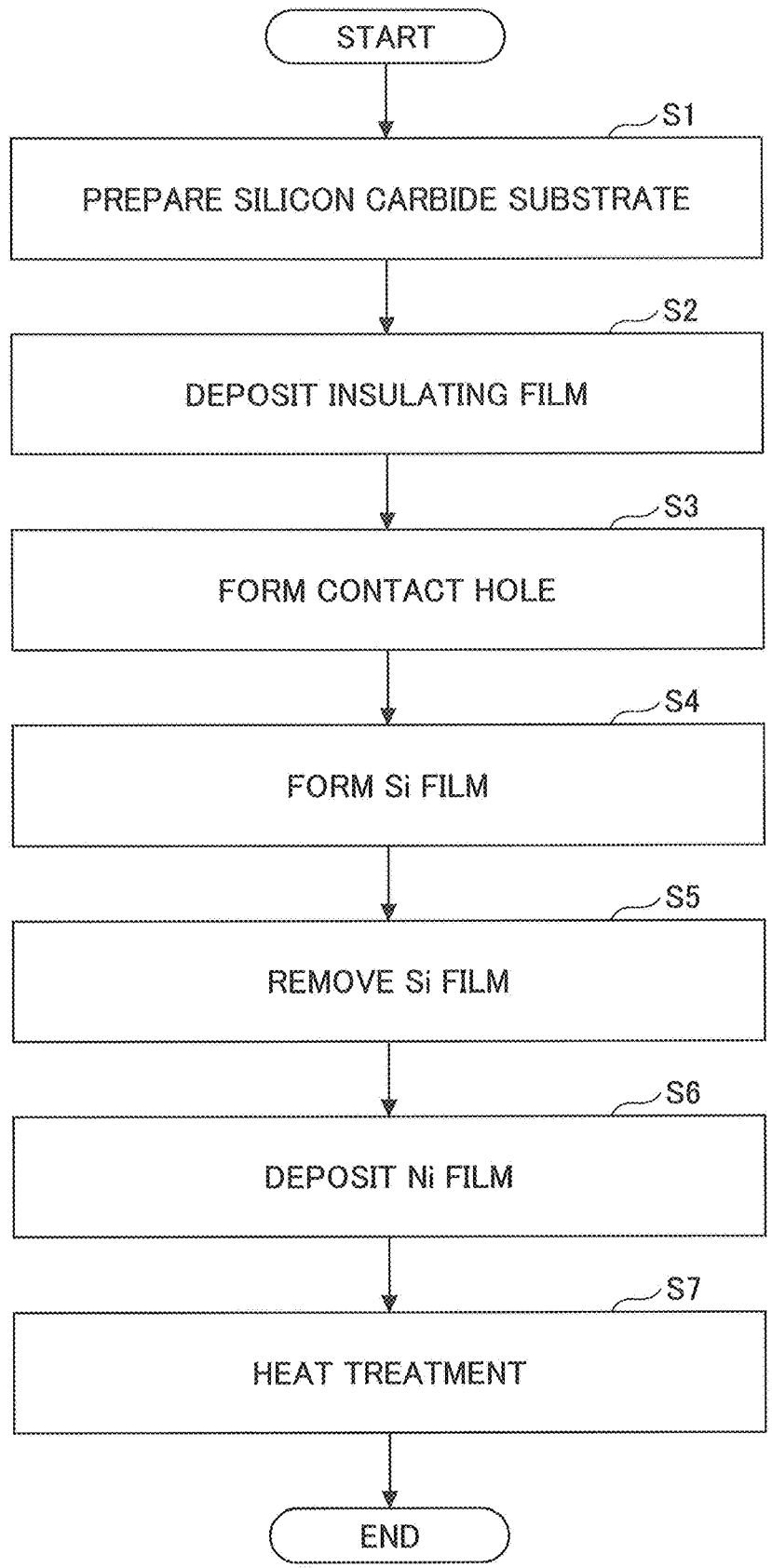
FIG. 6 is a flow chart of the method for manufacturing the semiconductor device according to one embodiment of the present disclosure.

Next, the method for manufacturing the semiconductor device according to one embodiment will be described, with reference to FIG. 6 through FIG. 14. FIG. 6 is a flow chart of the method for manufacturing the semiconductor device according to one embodiment of the present disclosure. FIG. 7 through FIG. 14 are process charts of the method for manufacturing the semiconductor device according to one embodiment of the present disclosure.

Figure 7:
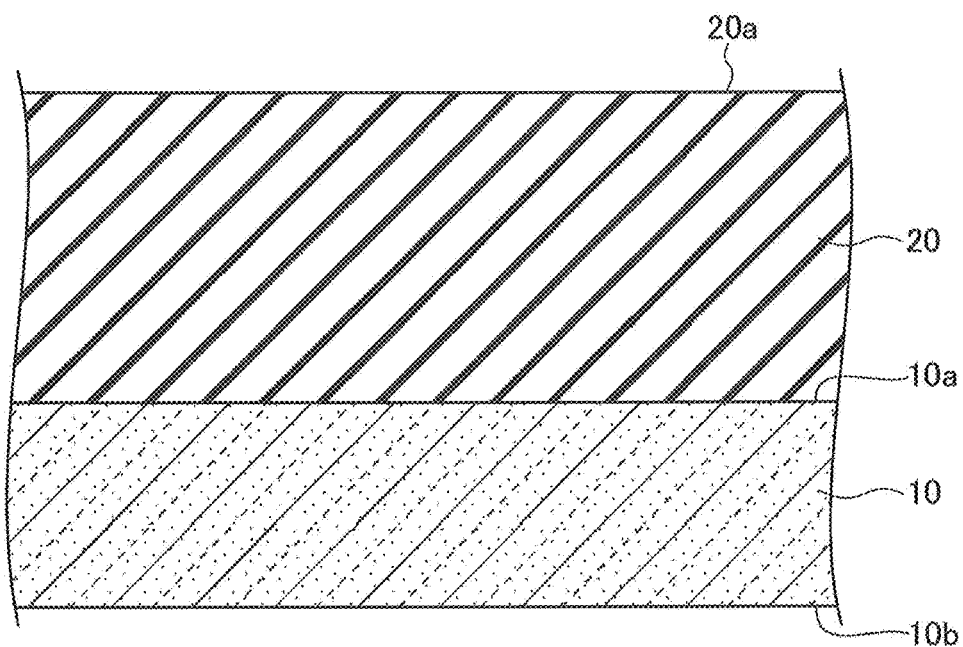
FIG. 7 is a process chart (1) of the method for manufacturing the semiconductor device according to one embodiment of the present disclosure.

First, as illustrated in FIG. 7, the silicon carbide substrate 10 having one principal surface 10a, and the other principal surface 10b, is prepared (step S1), and the insulating film 20 having a thickness of 0.8 μm, which becomes the interlayer insulator, is formed on the one principal surface 10a of the silicon carbide substrate 10 by CVD (Chemical Vapor Deposition) (step S2). The insulating film 20 is formed of silicon oxide.

Figure 8:
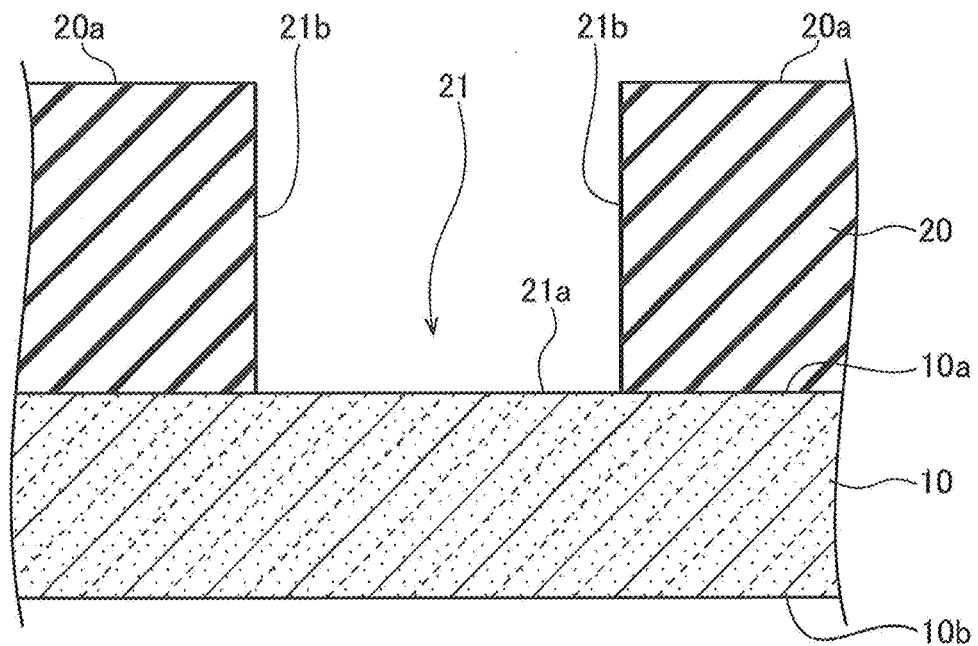
FIG. 8 is a process chart (2) of the method for manufacturing the semiconductor device according to one embodiment of the present disclosure.

Next, as illustrated in FIG. 8, the contact hole 21 is formed in the insulating film 20 (step S3). More particularly, a photoresist is coated to the top surface 20a of the insulating film 20, an exposure by an exposure apparatus and a developing are performed, to form a resist pattern, not illustrated, having an opening in a region where the contact hole 21 is to be formed. Thereafter, the insulating film 20 in regions where no resist pattern is formed is removed by dry etching, such as RIE (Reactive Ion Etching) or the like, so as to form the contact hole 21 which exposes the principal surface 10a of the silicon carbide substrate 10. Then, the resist pattern, which is not illustrated, is removed using an organic solvent or the like. As a result, it is possible to form the contact hole 21 having the bottom surface 21a formed by the principal surface 10a of the silicon carbide substrate 10, and the side surface 21b formed by the insulating film 20.

Figure 9:
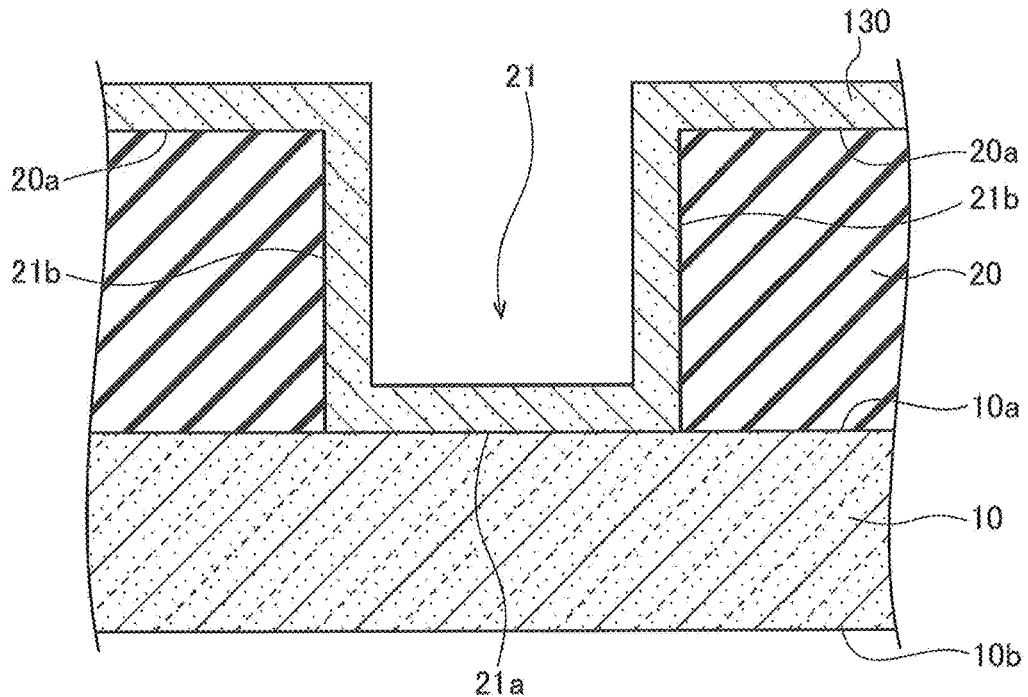
FIG. 9 is a process chart (3) of the method for manufacturing the semiconductor device according to one embodiment of the present disclosure.

Next, as illustrated in FIG. 9, a Si film 130 covering the bottom surface 21a and the side surface 21b of the contact hole 21, and the top surface 20a of the insulating film 20, is deposited by sputtering (step S4). A thickness of the deposited Si film 130 is 5 nm or greater but 100 nm or less. The thickness of the Si film 130 refers to the thickness of the portion of the Si film 130 covering the top surface 20a of the insulating film 20.

Figure 10:
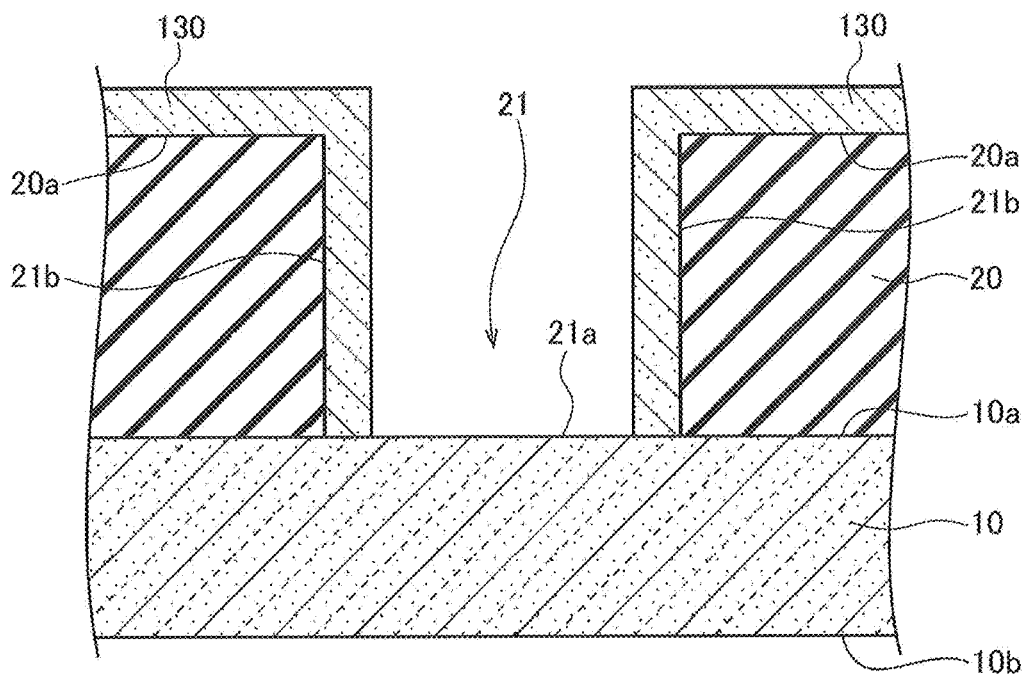
FIG. 10 is a process chart (4) of the method for manufacturing the semiconductor device according to one embodiment of the present disclosure.

Next, as illustrated in FIG. 10, the Si film 130 at the bottom surface 21a of the contact hole 21 is removed. More particularly, a resist pattern, not illustrated, having an opening corresponding to a shape of the bottom surface 21a of the contact hole 21, is formed, and the Si film 130 in regions where the resist pattern is not famed is removed by dry etching, such as RIE or the like. A fluorine-based etching gas or a chlorine-based etching gas is used as the etching gas. Thereafter, the resist pattern is removed using an organic solvent or the like. Accordingly, the Si film 130 at the bottom surface of the contact hole 21 is removed, so as to expose the principal surface 10a of the silicon carbide substrate 10 (step S5). The Si film 130 formed on the top surface 20a of the insulating film 20, and the side surface 21b of the contact hole 21, remains as is.

Figure 11:
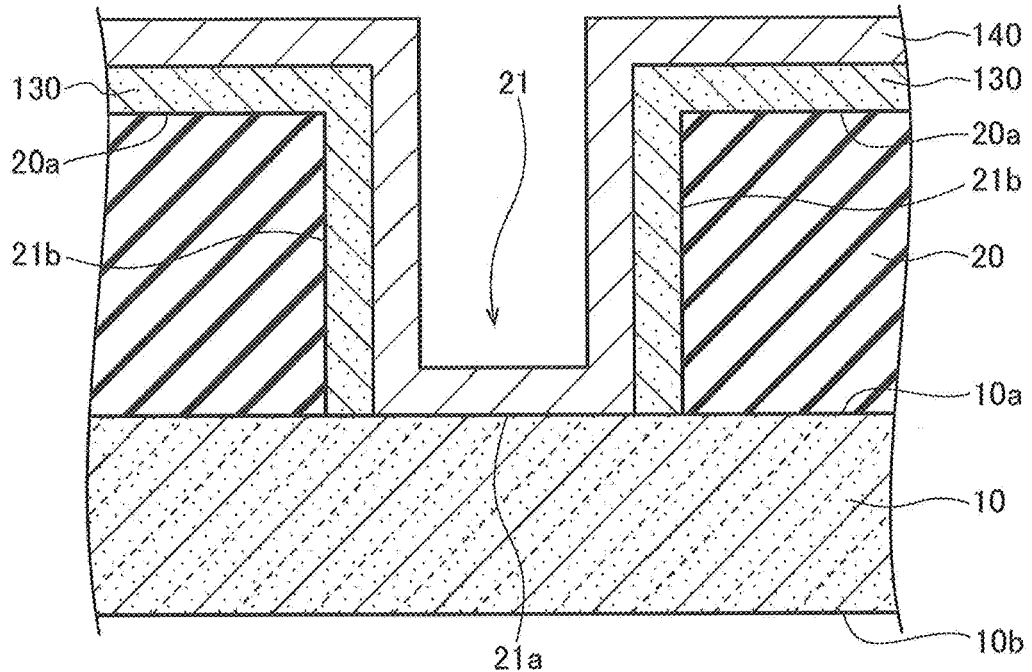
FIG. 11 is a process chart (5) of the method for manufacturing the semiconductor device according to one embodiment of the present disclosure.

Next, as illustrated in FIG. 11, a Ni film 140 is deposited on the principal surface 10a of the silicon carbide substrate 10 at the bottom surface 21a of the contact hole 21, and the Si film 130, by sputtering (step S6). A thickness of the deposited Ni film 140 is 5 nm or greater but 100 nm or less. The thickness of the Ni film 140 refers the thickness of the portion of the Ni film 140 covering the top surface 20a of the insulating film 20 via the Si film 130. The Si film 130 and the Ni film 140 are formed to thicknesses so that a number of atoms of Ni and a number of atoms of Si, per unit area accumulated in a direction of the thicknesses of the deposited Si film 130 and Ni film 140, is Ni>Si/2 at the bottom surface 21a of the contact hole 21. The direction of the thicknesses refers to a thickness direction of the Si film 130 and the Ni film 140, and is perpendicular to film surfaces of the Si film 130 and the Ni film 140.

Figure 12:
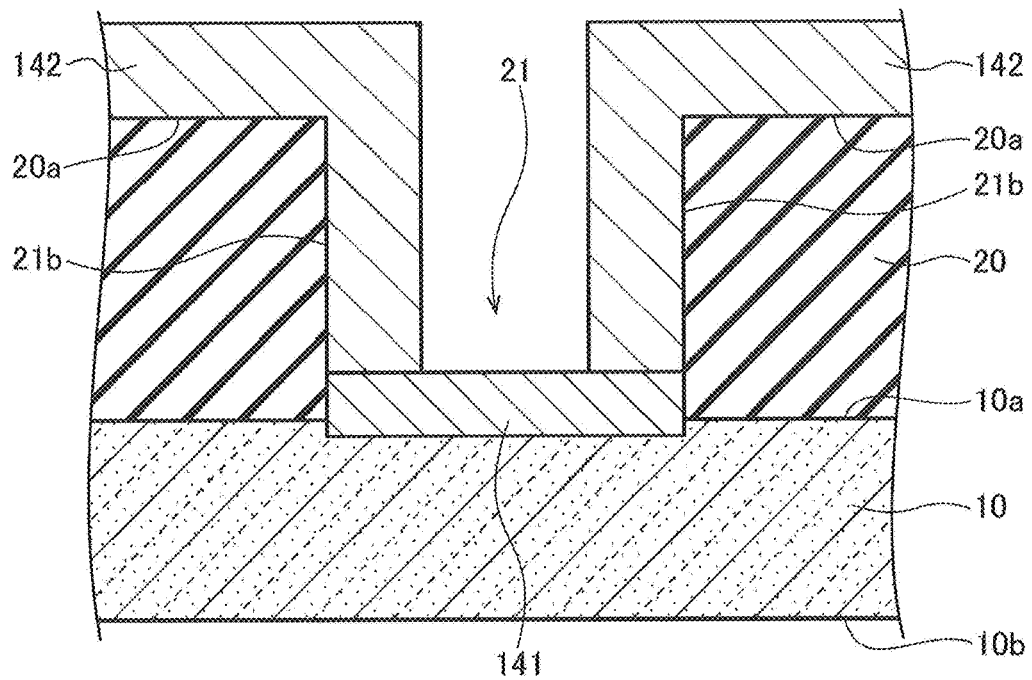
FIG. 12 is a process chart (6) of the method for manufacturing the semiconductor device according to one embodiment of the present disclosure.

Next, as illustrated in FIG. 12, the heat treatment is performed at a temperature of 800° C. or higher but 1100° C. or lower, such as a temperature of approximately 1000° C., for example (step S7). Hence, at the bottom surface 21a of the contact hole 21, the Si included in the silicon carbide substrate 10 reacts with the Ni included in the Ni film 140, to form a first alloy layer 141 made of a NiSi alloy. In addition, at the side surface 21b of the contact hole 21, and the top surface 20a of the insulating film 20, the Si included in the Si film 130 reacts with the Ni included in the Ni film 140, to form a second alloy layer 142 made of a NiSi alloy. In other words, the first alloy layer 141 is famed by the reaction between the Si included in the SiC forming the silicon carbide substrate 10, and the Ni included in the Ni film 140, and the second alloy layer 142 is formed by the reaction between the Si included in the Si film 130, and the Ni included in the Ni film 140. Accordingly, the first alloy layer 141 and the second alloy layer 142 are simultaneously formed by the heat treatment. The temperature of this heat treatment is the temperature of the silicon carbide substrate 10. For example, the heat treatment is performed using a furnace, and the temperature of the silicon carbide substrate 10 is substantially equal to the temperature inside the furnace.

For this reason, a Si concentration of Si included in the second alloy layer 142 is higher than that in the first alloy layer 141. Because the first alloy layer 141 is formed by the reaction between the nickel and the silicon carbide during the heat treatment, the first alloy layer 141 is mainly composed of unreacted carbon which does not react to $Ni_2Si$. For this reason, a content ratio of Si in the first alloy layer is at least 33% or less. In addition, a C concentration of C included in the first alloy layer 141 is higher than that in the second alloy layer 142. This is because the C included in the silicon carbide substrate 10 may enter the first alloy layer 141, while such an entry of the C to the second alloy layer 142 does not occur.

In the second alloy layer 142 formed in the manner described above, the Ni included in the Ni film 140 reacts with the Si included in the Si film 130, to form the NiSi alloy, and the Ni coagulation portion will not be formed. For this reason, a surface of the second alloy layer 142 on the top surface 20a of the insulating film 20 is flat.

Figure 13:
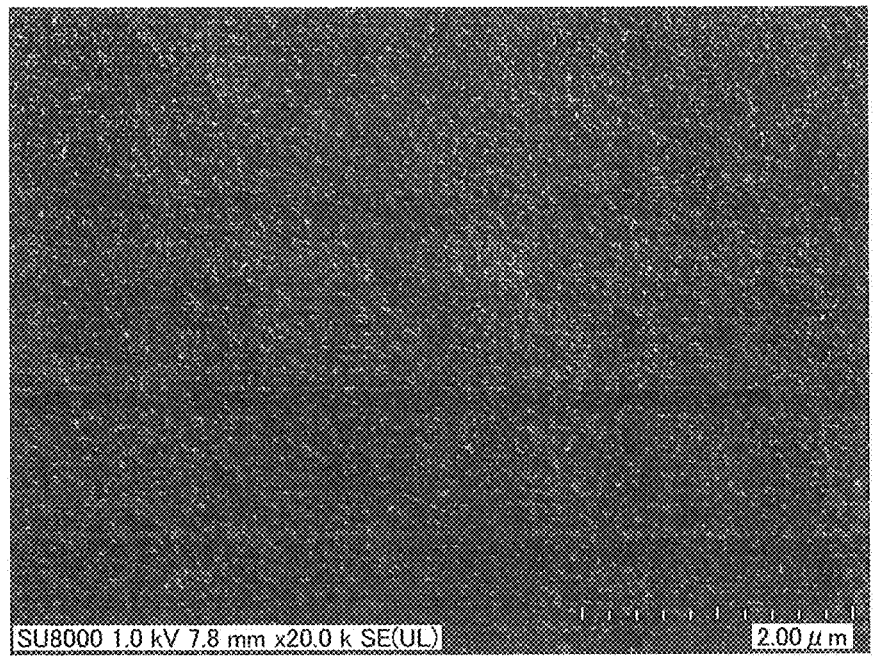
FIG. 13 is an SEM image of a state after depositing the Ni film and performing the heat treatment in the method for manufacturing the semiconductor device according to one embodiment of the present disclosure.

FIG. 13 is an SEM image of the top surface in this state observed by the SEM, and a magnification is 20,000 times.

Figure 14:
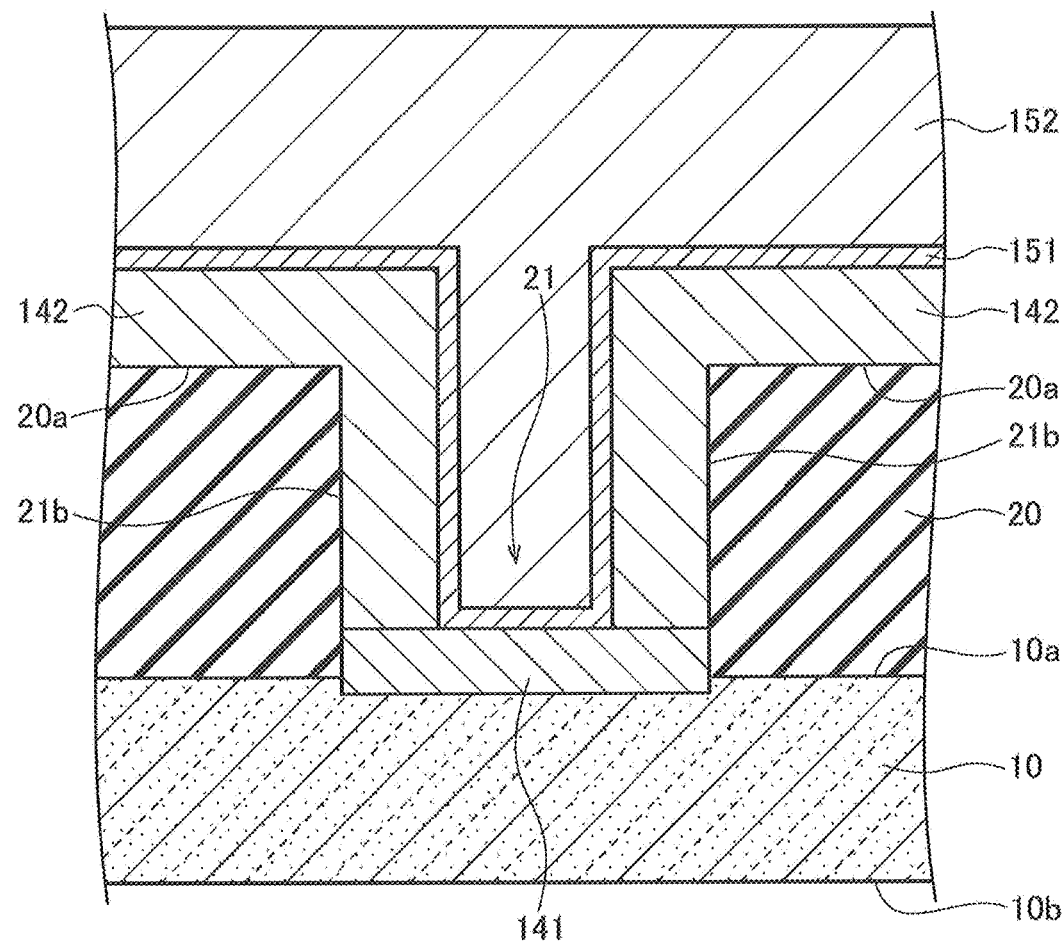
FIG. 14 is a process chart (7) of the method for manufacturing the semiconductor device according to one embodiment of the present disclosure.

Next, as illustrated in FIG. 14, a barrier layer 151 is famed on the second alloy layer 142 at the top surface 20a of the insulating film 20, using a barrier metal, and further, an interconnect layer 152 is formed on the barrier layer 151 using Al. The interconnect layer 152 may be formed of a metal other than Al, such as copper (Cu) or the like. Moreover, the barrier layer 151 is formed of TiN or TaN.

In this embodiment, because the surface of the second alloy layer 142 is flat, even if the barrier layer 151 is famed on the second alloy layer 142, no cracks or fractures will be generated in the barrier layer 151. Hence, it is possible to prevent the entry of Na or K from the outside, and improve the reliability of the silicon carbide semiconductor device.

In this embodiment, it is preferable that a Si concentration of Si included in the first alloy layer 141 is 33 atomic % or less, and that the Si concentration of Si included in the second alloy layer 142 is 33 atomic % or greater but 67 atomic % or less. Generally, any one of $Ni_2Si$, NiSi, and $NiSi_2$ is formed as the temperature reaches of the heat treatment temperature. If the original ratio of Si to Ni falls within this range, a combination of such compounds can eliminate the unreacted Ni or the unreacted Si. In addition, it is preferable that a ratio of the number of Si atoms, to a sum of the number of Si atoms and the number of Ni atoms, per unit area included in the Si film 130 and the Ni film 140 at the top surface 20a of the insulating film 20, is 33 atomic % or greater but 67 atomic % or less.

Figure 15:
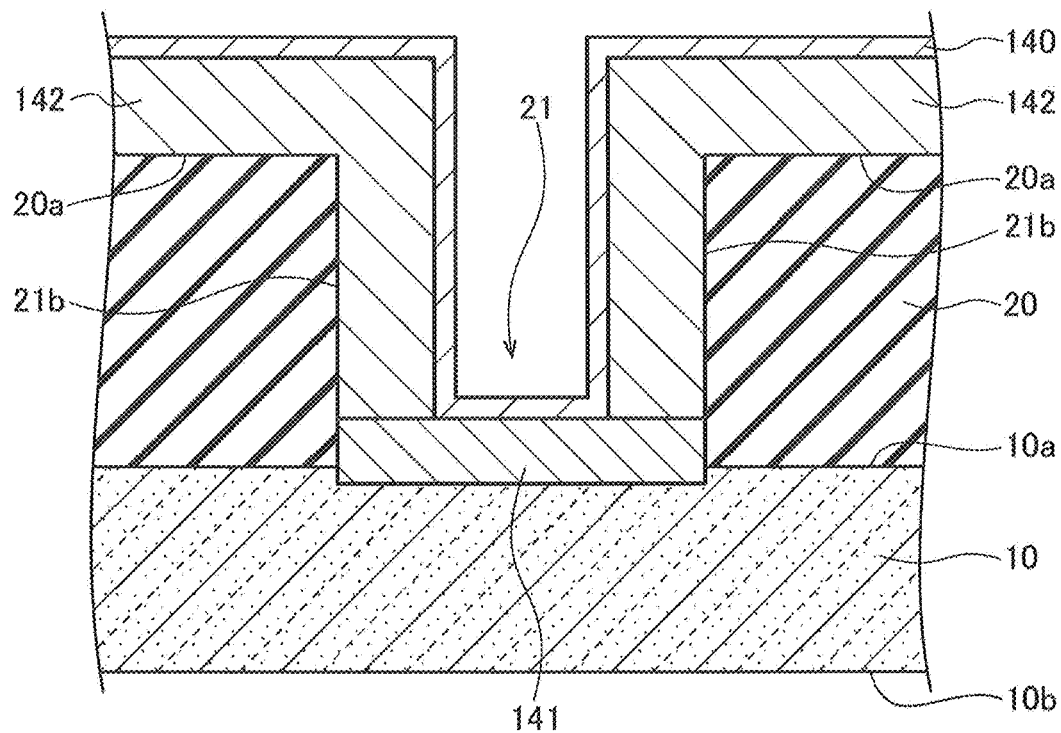
FIG. 15 is a diagram for explaining the method for manufacturing the semiconductor device according to one embodiment of the present disclosure.

In a case where the thickness of the Ni film 140 is thick, the unreacted Ni film 140 remains on the first alloy layer 141 and the second alloy layer 142, as illustrated in FIG. 15, even if the heat treatment is performed at the temperature of approximately 1000° C. In this case, the unreacted Ni film 140, that is, the portion of the Ni film 140 that did not react with either the silicon carbide substrate 10 or the Si film 130, is removed by wet etching, thereafter followed by deposition of the barrier layer 151, and forming of the interconnect layer 152, as illustrated in FIG. 14.

Further, in this embodiment, in the state illustrated in FIG. 11, because the side surface 21b of the contact hole 21 is covered by the Si film 130, the silicon oxide forming the side surface 21b of the contact hole 21 is not in direct contact with the Ni film 140. Accordingly, even if the heat treatment is performed at the temperature of approximately 1000° C., the Ni will not enter the insulating film 20, and the insulating film 20 will not deteriorate. In a case where a Ni film is in direct contact with the insulating film famed by the silicon oxide, the Ni enters the insulating film at a heating temperature of approximately 500° C., thereby deteriorating the insulating film.

(Semiconductor Device)

Figure 16:
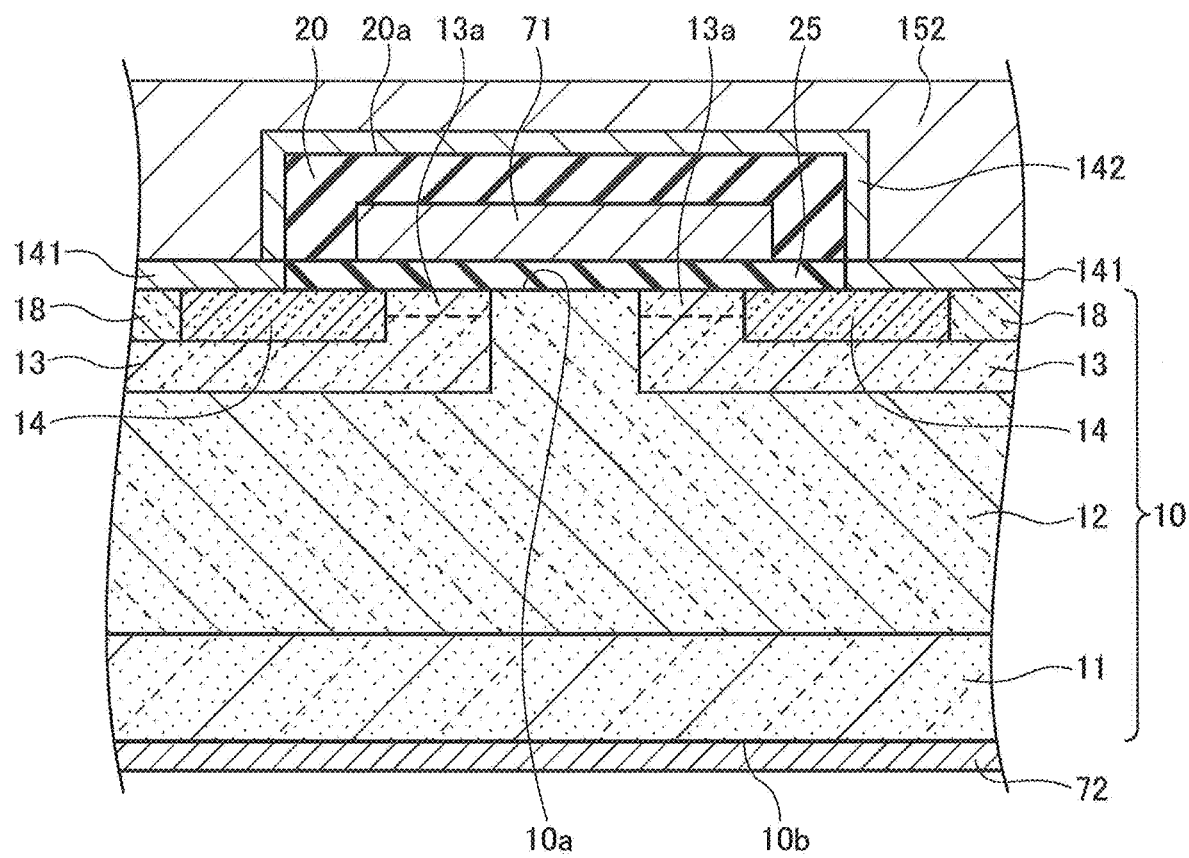
FIG. 16 is a diagram of a structure of the semiconductor device according to one embodiment of the present disclosure.

Next, an example of the semiconductor device according to this embodiment will be described. The semiconductor device according to this embodiment is a vertical MOSFET (Metal Oxide Semiconductor Field Effect Transistor), as illustrated in FIG. 16. More particularly, the semiconductor device according to this embodiment has the silicon carbide substrate 10, the first alloy layer 141, the second alloy layer 142, the interconnect layer 152, a gate insulating film 25, and a gate electrode 71. The gate electrode 71 is covered by the insulating film 20 which becomes the interlayer insulator, and the second alloy layer 142 is formed on the top surface 20a of the insulating film 20, or the like. The silicon carbide substrate 10 has a first n-type layer 11, a second n-type layer 12, a p-type body layer 13, an n-type source region 14, and a p-type region 18. The first n-type layer 11 and the n-type source region 14 are more heavily doped with impurity elements than the second n-type layer 12. The p-type region 18 is more heavily doped with impurity elements than the p-type body layer 13.

The first alloy layer 141 becomes the source electrode made by the manufacturing method according to this embodiment, and makes an ohmic contact with the n-type source region 14 on the one principal surface 10a (top surface in FIG. 16) of the silicon carbide substrate 10. The thickness of the first alloy layer 141 is approximately 100 to approximately 200 nm, for example. In addition, the interconnect layer 152 becomes a layer which forms a source interconnect.

The gate electrode 71 is provided on the one principal surface 10a (top surface in FIG. 16) of the silicon carbide substrate 10, via the gate insulating film 25, and opposes a channel region 13a on the surface side of the p-type body layer 13. In addition, a drain electrode 72 is provided on the other principal surface 10b (bottom surface in FIG. 16) of the silicon carbide substrate 10.

By forming a p-type collector layer on the side opposing the drain electrode 72 of the silicon carbide substrate 10, it is possible to form a vertical IGBT (Insulated Gate Bipolar Transistor) in place of a vertical MOSFET. In addition, it is possible to employ a structure (trench gate structure) in which the gate electrode is embedded in a trench, famed in the silicon carbide substrate, via a gate insulator.

Although the embodiments are described above in detail, the present disclosure is not limited to specific embodiments, and various variations and modifications may be made without departing from the scope of the appended claims.

DESCRIPTION OF REFERENCE NUMERALS

10 Silicon carbide substrate
10a One principal surface
10b Other principal surface
11 First n-type layer
12 Second n-type layer
13 P-type body layer
13a Channel region
14 N-type source region
18 P-type region
20 Insulating film
20a Top surface
21 Contact hole
21a Bottom surface
21b Side surface
25 Gate insulating film
30 Ni film
30a Ni aggregate
31 NiSi alloy layer
40 TiN film
50 Interconnect layer
71 Gate electrode
72 Drain electrode
130 Si film
140 Ni film
141 First alloy layer
142 Second alloy layer
151 Barrier layer
152 Interconnect layer

The invention claimed is:

1. A method for manufacturing a silicon carbide semiconductor device, comprising:
preparing a silicon carbide substrate;
depositing an insulating film on one principal surface of the silicon carbide substrate;
forming a contact hole in the insulating film, and exposing the one principal surface at a bottom surface of the contact hole;
forming a Si film on the bottom surface and a side surface of the contact hole, and a top surface of the insulating film;
removing the Si film on the bottom surface of the contact hole, and exposing the one principal surface;
depositing a Ni film on the bottom surface of the contact hole, and the Si film; and
performing a heat treatment after depositing the Ni film, wherein the heat treatment forms a first alloy layer, which becomes an ohmic electrode, at the bottom surface of the contact hole by Si included in the silicon carbide substrate and the Ni film, and forms a second alloy layer at the top surface of the insulating film by the Si film and the Ni film.

2. The method for manufacturing the silicon carbide semiconductor device as claimed in claim 1, wherein a temperature of the heat treatment is 800° C. or higher but 1100° ° C. or lower.

3. The method for manufacturing the silicon carbide semiconductor device as claimed in claim 1, wherein a ratio of a number of Si atoms, to a sum of the number of Si atoms and a number of Ni atoms, per unit area included in the Si film and the Ni film at the top surface of the insulating film, is 33 atomic % or greater but 67 atomic % or less, in a state after the depositing the Ni film and before the performing the heat treatment.

4. The method for manufacturing the silicon carbide semiconductor device as claimed in claim 1, wherein a thickness of the Ni film is 5 nm or greater but 100 nm or less.

5. The method for manufacturing the silicon carbide semiconductor device as claimed in claim 1, wherein a thickness of the Si film is 5 nm or greater but 100 nm or less, and a thickness of the Ni film is 5 nm or greater but 100 nm or less.

6. The method for manufacturing the silicon carbide semiconductor device as claimed in claim 1, further comprising:
removing, after the performing the heat treatment, an unreacted portion of the Ni film which does not react with either the silicon carbide substrate or the Si film, by wet etching.

7. The method for manufacturing the silicon carbide semiconductor device as claimed in claim 1, wherein the second alloy layer is also formed on the side surface of the contact hole.

8. A silicon carbide semiconductor device comprising:
a silicon carbide substrate having a first principal surface, and a second principal surface opposite to the first principal surface;
an insulating film provided on the first principal surface;
a contact hole provided in the insulating film;
a first alloy layer, including Ni and Si, in contact with the silicon carbide substrate at a bottom surface of the contact hole; and
a second alloy layer, including Ni and Si, provided on a top surface of the insulating film,
wherein the first alloy layer makes ohmic contact with the silicon carbide substrate, and
wherein a Si concentration of Si included in the second alloy layer is greater than a Si concentration of Si included in the first alloy layer.

9. The silicon carbide semiconductor device as claimed in claim 8, wherein the second alloy layer is also provided on a side surface of the contact hole.

10. The silicon carbide semiconductor device as claimed in claim 8, wherein a ratio of a number of Si atoms, to a sum of the number of Si atoms and a number of Ni atoms, per unit area included in the second alloy layer, is 33 atomic % or greater and 67 atomic % or less.

11. The silicon carbide semiconductor device as claimed in claim 8, further comprising:
a barrier layer provided on the second alloy layer; and
an interconnect layer provided on the barrier layer.

12. The silicon carbide semiconductor device as claimed in claim 11, wherein the barrier layer is formed of TiN or TaN.

13. The silicon carbide semiconductor device as claimed in claim 11, wherein the interconnect layer is formed of a metal including Al.

14. The silicon carbide semiconductor device as claimed in claim 11, wherein a ratio of a number of Si atoms, to a sum of the number of Si atoms and a number of Ni atoms, per unit area included in the second alloy layer, is 33 atomic % or greater and 67 atomic % or less.

15. The silicon carbide semiconductor device as claimed in claim 8, wherein a thickness of the Ni film is 5 nm or greater but 100 nm or less.

16. The silicon carbide semiconductor device as claimed in claim 15, wherein a thickness of the Si film is 5 nm or greater but 100 nm or less, and a thickness of the Ni film is 5 nm or greater but 100 nm or less.

17. The silicon carbide semiconductor device as claimed in claim 8, wherein a thickness of the Si film is 5 nm or greater but 100 nm or less, and a thickness of the Ni film is 5 nm or greater but 100 nm or less.

* * * * *